United States Patent
Bonifield et al.

(10) Patent No.: US 10,366,958 B2
(45) Date of Patent: Jul. 30, 2019

(54) WIRE BONDING BETWEEN ISOLATION CAPACITORS FOR MULTICHIP MODULES

(71) Applicant: Texas Instruments Incorporated, Dallas, TX (US)

(72) Inventors: Thomas Dyer Bonifield, Dallas, TX (US); Jeffrey Alan West, Dallas, TX (US); Byron Lovell Williams, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/857,234

(22) Filed: Dec. 28, 2017

(65) Prior Publication Data

US 2019/0206812 A1      Jul. 4, 2019

(51) Int. Cl.
| | |
|---|---|
| *B81B 7/00* | (2006.01) |
| *H01L 23/00* | (2006.01) |
| *H01L 23/64* | (2006.01) |
| *H01L 25/00* | (2006.01) |
| *H01L 27/07* | (2006.01) |

(Continued)

(52) U.S. Cl.
CPC .......... *H01L 23/642* (2013.01); *B81B 7/0032* (2013.01); *H01L 24/48* (2013.01); *H01L 24/49* (2013.01); *H01L 24/85* (2013.01); *H01L 25/0655* (2013.01); *H01L 25/50* (2013.01); *H01L 27/0733* (2013.01); *H01L 28/40* (2013.01); *H01L 2224/4807* (2013.01); *H01L 2224/48137* (2013.01)

(58) Field of Classification Search
CPC ......... H01L 24/48; H01L 24/49; H01L 24/85; H01L 2224/48137; H01L 2224/48138
See application file for complete search history.

(56) References Cited

U.S. PATENT DOCUMENTS 6,150,206 A      11/2000   Oh
6,854,637 B2 *   2/2005    Harun ............... B23K 20/004
                                              228/180.5

(Continued)

FOREIGN PATENT DOCUMENTS

EP      2779226 A1     9/2017
JP      2004031912 A   1/2004

OTHER PUBLICATIONS

PCT Search Report for Application No. PCT/US 2018/065257 dated Apr. 25, 2019.

*Primary Examiner* — David A Zarneke
(74) *Attorney, Agent, or Firm* — Andrew R. Ralston; Charles A. Brill; Frank D. Cimino (57) ABSTRACT

A packaged multichip device includes a first IC die with an isolation capacitor utilizing a top metal layer as its top plate and a lower metal layer as its bottom plate. A second IC die has a second isolation capacitor utilizing its top metal layer as its top plate and a lower metal layer as its bottom plate. A first bondwire end is coupled to one top plate and a second bondwire end is coupled to the other top plate. The second bondwire end includes a stitch bond including a wire approach angle not normal to the top plate it is bonded to and is placed so that the stitch bond's center is positioned at least 5% further from an edge of this top plate on a bondwire crossover side compared to a distance of the stitch bond's center from the side opposite the bondwire crossover side.

20 Claims, 8 Drawing Sheets

(51) Int. Cl.
*H01L 49/02* (2006.01)
*H01L 25/065* (2006.01)

(56) References Cited

U.S. PATENT DOCUMENTS

| | | | |
|---|---|---|---|
| 6,927,156 B2 * | 8/2005 | Mathew | H01L 24/03 |
| | | | 257/E23.02 |
| 9,165,842 B2 | 10/2015 | Gillotti | |
| 9,299,697 B2 | 3/2016 | West et al. | |
| 2007/0170573 A1 * | 7/2007 | Kuroda | H01L 24/29 |
| | | | 257/686 |
| 2012/0187530 A1 | 7/2012 | Zhang et al. | |
| 2012/0319260 A1 * | 12/2012 | Kim | H01L 23/4334 |
| | | | 257/676 |
| 2016/0133690 A1 | 5/2016 | West et al. | |
| 2016/0240499 A1 * | 8/2016 | Yamada | H01L 24/06 |
| 2017/0103969 A1 | 4/2017 | Krause et al. | |
| 2018/0096908 A1 * | 4/2018 | Mikado | H01L 23/28 |

* cited by examiner

WIRE BONDING BETWEEN ISOLATION CAPACITORS FOR MULTICHIP MODULES

FIELD

This Disclosure relates to the assembly of multichip modules including at least 2 different die each containing high voltage isolation capacitors to which bondwires directly couple together their respective top plates.

BACKGROUND

In circuit designs where high voltage (HV) or high current is present, it is generally necessary to take steps to reduce the potential risk to users of the electrical system. These steps traditionally include insulation, grounding, and the isolation of dangerous voltages and currents by galvanic isolation, being the technique of isolating functional sections of electrical systems to prevent current flow between them.

An isolation device prevents the propagation of DC and unwanted AC currents between its input and output while allowing the transmission of the desired AC signal. The isolation device accomplishes this function using an isolation barrier that has a high breakdown voltage and low leakage. A high resistive path exists across the isolation barrier, but the device can still transfer information in the desired AC signal across the isolation barrier by capacitive, inductive, or optical techniques.

Basic isolation provides protection against HV as long as the isolation barrier is intact. Basic isolation thus needs to be coupled to another basic isolation barrier for safety if human access is possible. Reinforced isolation is equivalent to two basic isolation barriers in series and is thus by itself sufficient as a safety barrier against HV. Most reinforced-isolation devices ensure safety using capacitive isolation technology under the worldwide standard VDE 0884 for magnetic and capacitive isolation-based reinforced-isolation. Capacitive isolators primarily use high-voltage silicon-dioxide ($SiO_2$) capacitors to provide the isolation. With a dielectric strength of about 300 to 1,400 V/µm, $SiO_2$ has the highest dielectric strength among commonly used HV isolation materials. Silicon nitride may also be used as part or all of the capacitor's dielectric.

One common reinforced-isolation device arrangement is a packaged multichip module, where each integrated circuit (IC) die in the package includes at least one embedded HV isolation capacitor (ISO cap), such as using two thick $SiO_2$ capacitors connected in series by a bondwire between the input and the output that together constitute a double isolation barrier. The wafer fab process can be a high-performance analog or complementary metal-oxide-semiconductor (CMOS) process having multilevel metal levels, where the HV capacitor is formed between certain metal layers, and there is active circuitry formed in the semiconductor substrate or semiconductor surface (e.g., silicon) below the ISO capacitor.

Each ISO cap generally utilizes the top metal layer (say layer n) as its top plate and a lower metal layer (e.g., n-3 or lower) as its bottom plate, where the dielectric for the ISO cap comprises the respective interlevel dielectric (ILD) layers stacked on one another between the bottom and the top plate. Each ISO cap also includes a bond pad opening on its top plate for the top plate connection, and an indirect connection to its bottom plate is generally provided by circuitry from which the HV is being isolated. The bottom plate connector is typically coming from a digital signal generator or leads to a digital to analog converter (depending on which way the signal is going through the ISO cap) on the IC which creates or reads the signals which propagate across the isolation barrier. The bottom plate on one of the ISO caps is sourcing the signal to be sent across the isolation barrier, and the bottom plate on the other ISO cap (in series) is receiving this signal.

For the capacitive reinforced-isolation of the packaged multichip module, bondwires can be directly bonded to the top plate of the ISO cap on one die and to the top plate of the ISO cap on the other die, where there is a ball bond on one top plate and a stitch bond on the other top plate. Stitch bonding generally uses impulse welding or heat and pressure while feeding the wire through a hole in the center of the welding electrode. The first bond made during the assembly process referred to as a ball bond is made at one end of the bondwire to the top plate bond pad of the first ISO cap on the first die and is essentially normal (90°) to the plane of surface of the top plate. The other end (second formed end) of the bondwire includes a stitch bond that has a wire approach angle that is not normal to the plane of surface of the top plate bond pad of the second ISO cap of the second die, such as at an angle of about 30° to 40° relative to the surface of the top plate.

SUMMARY

This Summary is provided to introduce a brief selection of disclosed concepts in a simplified form that are further described below in the Detailed Description including the drawings provided. This Summary is not intended to limit the claimed subject matter's scope.

A packaged multichip device includes a first IC die with an isolation capacitor utilizing a top metal layer as its top plate and a lower metal layer as its bottom plate. A second IC die has a second isolation capacitor utilizing its top metal layer as its top plate and a lower metal layer as its bottom plate. A first bondwire end is coupled to one top plate and a second bondwire end is coupled to the other top plate. The second bondwire end includes a stitch bond including a wire approach angle not normal to the top plate that is bonded to and is placed so that the stitch bond's center is positioned at least 5% further from an edge of this top plate on a bondwire crossover side compared to a distance of the stitch bond's center from the side opposite the bondwire crossover side.

BRIEF DESCRIPTION OF THE DRAWINGS

Reference will now be made to the accompanying drawings, which are not necessarily drawn to scale, wherein.

DETAILED DESCRIPTION

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed aspects recognize for packaged multichip devices having reinforced isolation with ISO caps wirebonded between the die, the non-normal approach angle of the bondwire associated with the stitch bond to the top plate establishes a worst-case electric (E)-field across the mold compound (MC) which surrounds the bondwire at HV (e.g., 750 V root mean square (rms)) during multichip device operation relative to the bottom plate of the ISO cap which is at a relatively low voltage (e.g., 0 V). In the event of MC dielectric breakdown, the E-field near the ISO cap can increase significantly, leading to a reduction in the isolation barrier lifetime and thus the lifetime of the whole IC or electronic system, such as in one particular example a digital isolator that uses series connected silicon oxide-based ISO caps to form the isolation barrier. Internally the digital isolator includes two die connected by bondwire(s) that couple the top plate bond pad(s) of the ISO cap(s) on the transmitter chip to the top plate bond pad(s) of the ISO cap(s) on the receiver chip.

Conventionally, a minimum ISO cap top plate area is achieved by placing the wirebond position in a dielectric aperture over the center of the top plate (see FIG. 4B described below) and using minimum dimensions for the surrounding dielectric opening that may comprise a polyimide (PI) layer on a Protective Overcoat (PO) layer. No consideration is given for the directionality or the offsetting in position of the stitch bond from the point at which the bondwire crosses over the edge of the ISO cap.

Figure 1A:
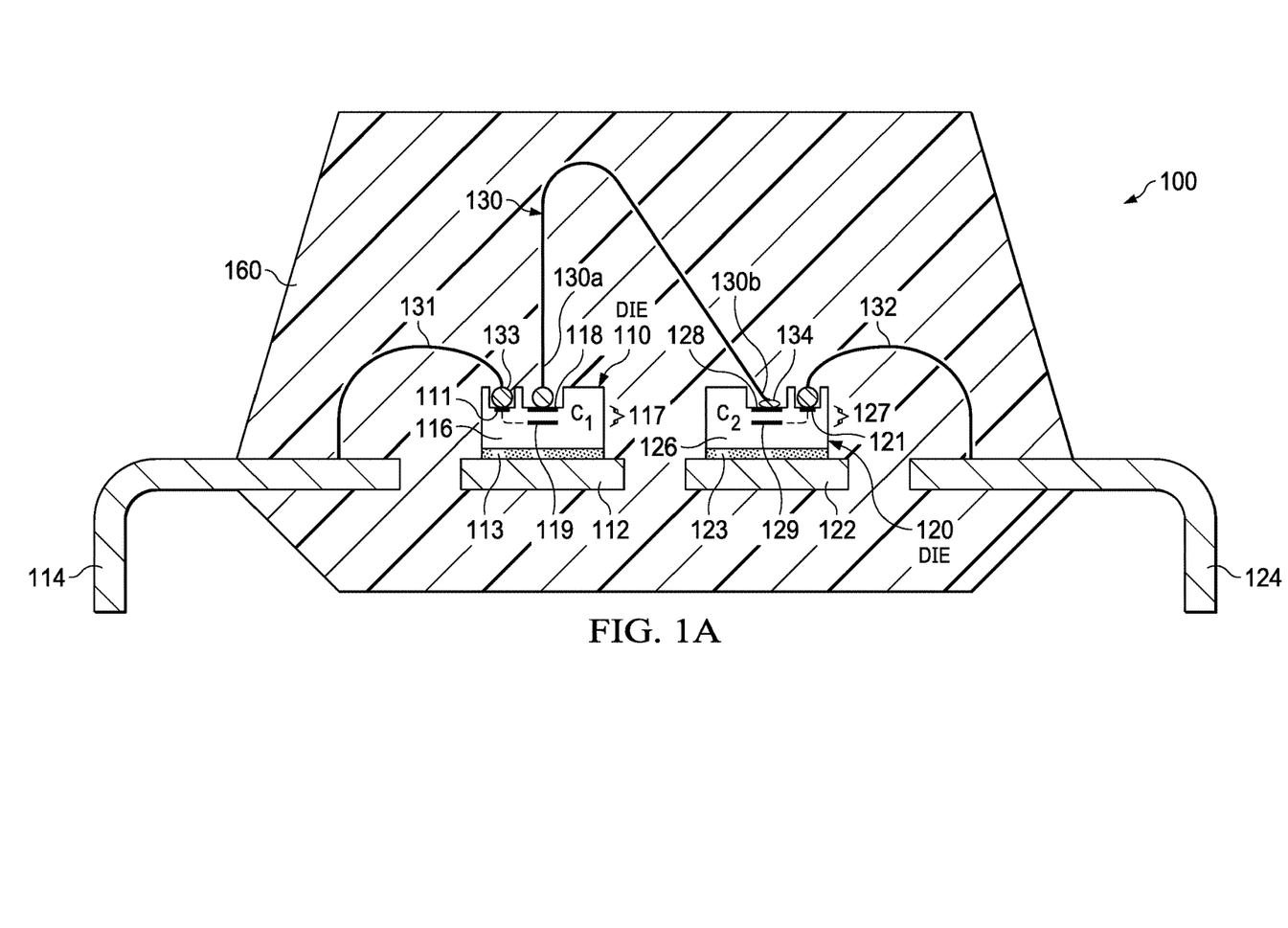
FIG. 1A is a cross sectional view of an example packaged multichip device having reinforced isolation with ISO caps wire bonded together with asymmetric bonding to provide the bondwire which in device operation will be at HV an additional distance from the low voltage regions of the IC die, according to an example aspect.

FIG. 1A is a cross sectional view of an example packaged multichip device 100 having reinforced isolation with ISO caps on respective IC die wire bonded together with asymmetric bonding, according to an example aspect. The asymmetric bonding provides the bondwire 130 which in device operation will be at a HV an additional distance from the low voltage regions of the second IC die 120 (e.g., 0 V) that are coupled to the bottom plate 129. A first IC die 110 is on a die attach adhesive 113 on a first die pad 112 that includes functional circuitry 116 with a metal stack 117 thereon including a top metal layer and a plurality of lower metal layers. The first IC die 110 includes at least a first isolation capacitor (first ISO cap) shown as $C_1$ that utilizes the top metal layer as a first top plate 118 and has a first bottom plate 119.

Due to the series connection provided by the ISO caps, during operation of the packaged multichip device 100 based on the voltage divider rule the bondwire 130 is generally at one half the HV difference between the bottom plate 119 of the first IC die 110 and the bottom plate 129 of the second IC die 120. However, in some somewhat uncommon applications, the voltage on the top plate may not be equal to one half the HV difference, but instead some other fraction that results from the respective ISO cap capacitances not being equal to one another in the series assembly. The full HV appears between the first die pad 112 and the second die pad 122 (same HV as being between the bond pad 111 and the bond pad 121).

The first top plate 118 has a top dielectric layer thereon (see FIG. 1B below which describes the top dielectric layer as comprising a dielectric layer 162 on a dielectric layer 161) that has a top plate dielectric aperture, with one of the lower metal layers as its bottom plate. Similarly, a second IC die 120 is on the die attach adhesive 123 on the second die pad 122 including functional circuitry 126 with a metal stack thereon 127 including a top metal layer and a plurality of lower metal layers, with at least a second ISO cap shown as $C_2$ utilizing the top metal layer as the second top plate 128 along with the second bottom plate 129. The second top plate 128 has a top dielectric layer thereon having a top plate dielectric aperture and one of the lower metal interconnect layers as its bottom plate.

Figure 1B:
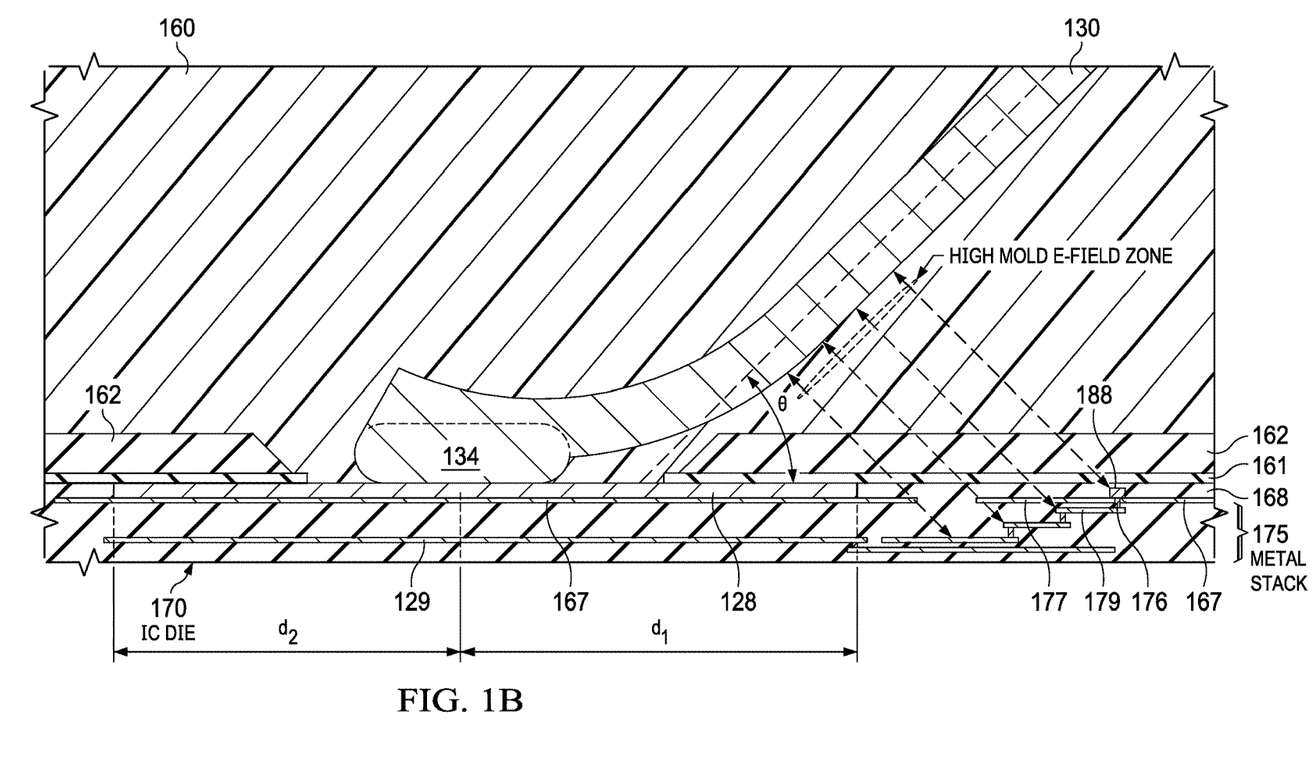
FIG. 1B is a depiction of a bondwire making an asymmetric stitch bond to a top plate of an ISO cap, according to an example aspect.

Bond pads comprising the top metal layer are indirectly coupled to the bottom plates 119 and 129 of the ISO caps through vias and intermediate metal levels (such as shown in FIG. 1B described below) as well as circuitry (depicted by dashed lines shown in FIG. 1A). The bond pad 111 is coupled by connection circuitry depicted by a dashed line to the first bottom plate 119, and the bond pad 121 coupled by connection circuitry depicted by a dashed line to the second bottom plate 129. The circuitry for coupling bond pads to the bottom plates 119 and 129 generally comprises analog-to-digital converters or digital-to-analog converters which includes groups of transistors, before going through vias and the respective metal levels of their metal stacks to reach their respective bond pads 111 and 121.

During multichip device 100 operation, there is generally an analog signal that comes into the multichip device 100 externally from the first lead 114 and the second lead 124 that get connected by bondwires 131, 132 to the die bond pads 111 and 121, respectively. In typical operation, there will generally be signals either coming from the first lead 114 pin that gets sent across to the other side of the isolation barrier, such as to the pin of the second lead 124, or coming from second lead 124 and being sent across the isolation barrier back to first lead 114. One series cap HV cap pair either transmits across the ISO barrier or receives from the other side of the ISO barrier, but not both. Generally, there can be more than one communication "channel" on the IC die and the die can have either one channel as a transmit channel and 3 channels as receive channels (on a 4-channel device), or any combination of transmit/receive channels on a device that has 1 to 6 channels. Then the signal from the die bond pads 111 and 121 get routed to signal processing circuitry to send/receive digital signals to the bottom plates 119 and 129 that will transmit across the ISO barrier provided by $C_1$ and $C_2$.

The leads 114, 124 together with the first die pad 112 and second die pad 122 may collectively be termed a 'split leadframe'. The leadframe as known in the art is generally manufactured by plating Ni and Au material onto a flat sheet of copper or copper-alloy material and either etching or stamping this material into the desired form to provide external pads, routing, and die supports within the package.

Functional circuitry 116 and 126 realizes and carries out a desired functionality, such as that of a digital IC or an analog IC, and in one aspect comprises a BiCMOS (MOS and Bipolar) IC. The capability of the functional circuitry provided on an IC mentioned herein may vary, for example ranging from a simple device to a complex device. The specific functionality mentioned herein contained within functional circuitry is not of importance.

A first end 130a of the bondwire 130 is coupled within the top plate aperture on the first top plate 118. A second end 130b of the bondwire 130 is coupled within the top plate aperture on the second top plate 128. Although each IC die 110, 120 is shown having a single ISO cap so that there is a single ISO cap to ISO cap bondwire, each IC die can have multiple ISO caps so that there can be a plurality of disclosed ISO Cap to ISO Cap bondwires. (See FIGS. 4A and 4B described below showing an IC die with 2 ISO caps).

The bondwire 130 is embedded in a mold compound 160, typically a heterogeneous material comprising epoxy with embedded silica filler particles. The second end 130b of the bondwire includes a stitch bond shown as 134 that has a wire approach angle which is not normal to the surface of the second top plate 128. The wire approach angle relative to the top surface of the second top plate 128 of the IC die 120 shown in FIG. 1B as θ as described below is in a range from 25° to 50°, generally 30° to 40°, and is typically around 35°. The stitch bond is asymmetrically placed so that a center of the stitch bond 134 is positioned at least 5% further from an edge of the second top plate 128 on the bondwire crossover side (the left side in FIG. 1A) as compared to a distance of the center of the stitch bond 134 from an opposite located non-bondwire crossover side of the second top plate 128 (the right side in FIG. 1A). The asymmetric bondwire placement is in a range from 5% to 200%, and is typically at least 50%, such as around 80%. There is a ball 133 shown on the first top plate 118, and on the bond pads 111 and 121.

The first ISO and second ISO caps generally can have silicon oxide as their capacitor dielectric layer. The ISO caps and generally have a capacitor dielectric layer thickness of at least 4 μm to provide a nominal breakdown voltage of at least 2,000 Volts. The capacitor dielectric layer thickness is more generally 2 μm to 20 μm.

It is advantageous to configure the second top plate 128 with the stitch bond 134 placed as close as possible to the side opposite the bondwire crossover side of the second top plate 128, for example only being limited by applicable design rules. On the bondwire crossover side, the second top plate 128 is extended further so that the height of the bondwire 130 is higher at the point where it crosses over the outer edge of the top plate and thus reduces the electric field in the mold compound near the bondwire 130.

For example, due to asymmetric extension of the top plate 128 the top dielectric layer (see dielectric layer 162 on dielectric layer 161 in FIG. 1B described below) may extend over the top plate 128 at least 20% more on the bondwire crossover side as compared to a distance the top dielectric layer extends over the second top plate from the side opposite the bondwire crossover side. In some arrangements, the top dielectric layer may extend over the top plate 128 at least 80% more on the bondwire crossover side as compared to a distance the top dielectric layer extends over the second top plate from the side opposite the bondwire crossover side. As noted above, the asymmetrically placed stitch bond thus enables the bondwire 130 that carries HV during device operation to achieve a maximum distance above the metal stack 127 within the second IC die 120, lowering the electric field between them.

FIG. 1B is a depiction of a bondwire 130 having an asymmetric stitch bond to the second top plate 128 of an ISO cap, showing a part of an IC die shown as 170, according to an example aspect. It is noted the bondwire 130 in FIG. 1B is turned in an opposite direction relative to the bondwire 130 in FIG. 1A. The second top plate 128 has a top plate dielectric aperture for bonding the bondwire 130 shown generally formed by etching an aperture in at least one top dielectric layer shown in FIG. 1B as dielectric layer 162 on dielectric layer 161. In one particular arrangement, the dielectric layer 162 can comprise a polyimide (PI) layer and the dielectric layer 161 can comprise an inorganic PO layer. The dielectric layer 161 is on another dielectric layer which can comprise silicon oxide that is lateral to the second top plate 128 which is shown as 168.

Between the main dielectric stack within the metal stack 175 for the ISO cap and the second top plate 128 there is shown an optional additional dielectric layer as 167 that is described in U.S. Pat. No. 9,299,697 to West et al. This dielectric layer 167 comprises a lower-bandgap dielectric layer (relative to silicon oxide) which generally includes a first sub-layer of silicon oxide nitride, generally 200 nanometers to 600 nanometers thick, contacting the main dielectric of the ISO cap and a second sub-layer of silicon nitride, generally 200 nanometers to 600 nanometers thick, between the first sub-layer and the second top plate 128, contacting both. The first sub-layer of silicon oxide nitride has a lower bandgap energy compared to the silicon oxide-based dielectric material of the main dielectric of the ISO cap, and the second sub-layer of silicon nitride has a lower bandgap energy than the first sub-layer. The additional dielectric layer 167 extends laterally past the second top plate 128. During operation of the IC, when a high voltage is applied to the second top plate 128 and a low voltage is applied to its associated bottom plate 129, the lower-bandgap additional dielectric layer 167 provides added reliability for the main dielectric of the ISO cap by reducing the electric field at corners of the second top plate 128.

As described above, the stitch bond is asymmetrically placed so that a center of the stitch bond 134 is positioned at a distance shown as $d_1$ in FIG. 1B that is at least 5% further from an edge of the second top plate 128 on the bondwire crossover side (the right side in FIG. 1B) as compared to a distance shown as $d_2$ of the center of the stitch bond 134 from an opposite located non-bondwire crossover side of the second top plate 128 (the left side in FIG. 1B). As shown in FIG. 1B, $d_1$ is about 40% greater than $d_2$. For the case of a top plate dielectric that comprises multiple layers as shown in FIG. 1B, when a different distance being the distance from the edge of the dielectric aperture to the center of the stitch bond 134 is used herein, it is measured relative to the furthest extending dielectric toward the stitch bond, here relative to dielectric layer 161 which extends beyond dielectric layer 162 toward the stitch bond 134.

The bondwire 130 is embedded within a mold compound 160. The bottom plate 129 can be seen to be connected to a top metal layer pad 188 that although not shown in FIG. 1B, as described below the top metal layer pad 188 connects to circuitry on the IC such as an analog-to-digital converter that is itself connected to the bottom plate 119 or 129 that is connected through a bond wire shown as bondwire 131 or 132 in FIG. 1A.

The top metal layer pad 188 and the bond pad it is connected to are positioned lateral to the second top plate 128 by a metal stack 175 comprising filled vias with one of these filled vias shown in FIG. 1B as 176 (e. g., W filled vias) through ILD layers such as ILD layer 177 and intermediate metal layers such as metal layer 179 that are between the metal layer used by the bottom plate 129 and the top metal level, which are the low voltage regions of the IC die. As noted above, the low voltage regions of the IC die as used herein refers to all metal levels on the IC die other than the top metal level, where the top plate in operation is a HV pad as it is the pad which the bondwire 130 which carries the HV is bonded to.

The breakdown strength of commercially available MCs, typical being silica particles embedded in epoxy, may be only half the dielectric breakdown strength of a polyimide overcoat. Two headed dashed-line arrows are shown in FIG. 1B between the bondwire 130 and the metal levels of the bottom plate connection to the top metal layer pad 188 which due to the minimum relative distance to the metal coupled to the bottom plate 129 of the ISO cap is where the highest E field exists across the mold compound 160. As noted above, the angle (θ) of the bondwire 130 shown in FIG. 1B and the IC die 120 surface is at an angle that is >25° from the plane of the die surface.

The wafer fabrication process to form ISO caps that can benefit from disclosed asymmetric wire bonding is a multilevel metal process, with the ISO caps formed between metal layers with the top plate generally utilizing the top metal level. Capacitive isolators primarily use HV silicon oxide capacitors to provide isolation. With a dielectric strength of 300 to 1,400 V/μm, silicon oxide has the highest dielectric strength among HV isolation materials commonly used. Unlike polyimide and other polymer-based dielectric materials, silicon oxide is essentially free of voids and the reliability of a silicon oxide capacitor does not degrade with exposure to ambient moisture. This structure achieves the silicon oxide thickness needed for HV isolation using standard ILD layers. The multilayered structure improves quality and reliability by reducing the dependence of the HV performance on any single dielectric layer.

A variety of different methods can be used to form ICs having ISO caps that can utilize disclosed asymmetric wire bonding between ISO caps for multichip modules. For example, FIGS. 2A-E depict in a cross-sectional view steps a series of example IC process fabrication steps described herein for forming an ISO capacitor capable of HV operation.

Figure 2A:
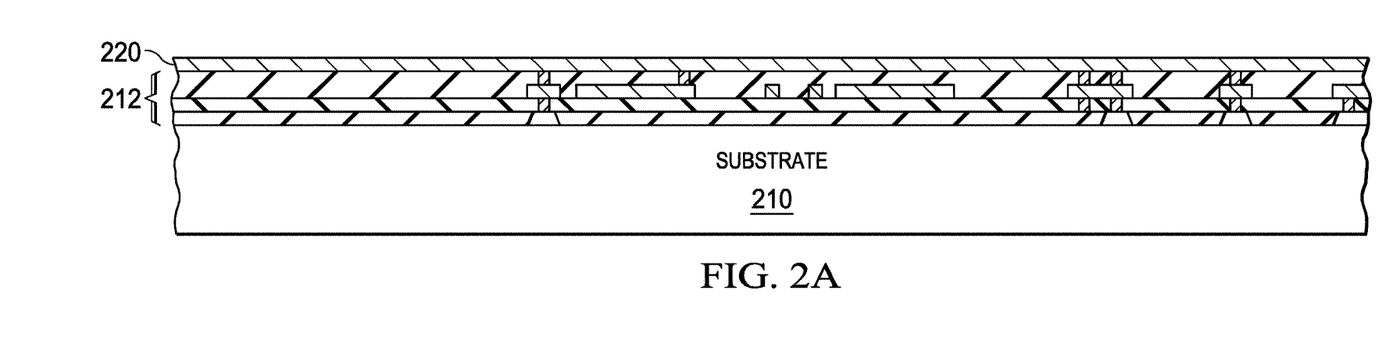
FIGS. 2A-2E are cross-sectional diagrams showing processing progression for an example method of forming ISO cap(s) on an IC, according to an example aspect.

FIG. 2A illustrates in a cross-section view the structure of an in-process ISO cap on an IC shown at the beginning of the formation of the bottom capacitor plate. Depicted in FIG. 2A is a semiconductor substrate 210, and the processing layers 212 thereon that represent multiple layers formed during front end processing in prior preformed conventional semiconductor processing steps, and the metal layer 220 which will become a bottom capacitor plate in the final ISO capacitor arrangement. In the layers 212, the prior processing steps may form various devices (not shown for simplicity) in the substrate 210 and interconnect them, such as transistors including MOS transistors, bipolar transistors, FETs, diodes, resistors, inductors, capacitors and the like. These components can be interconnected using metal layers and inter-metal dielectric layers, the metal layers being connected to one another and to the substrate using via and contacts to connect the layers as are known to those having ordinary skill in the art of semiconductor fabrication.

Metal layer 220 can be, for example, aluminum or copper or alloys thereof, the metal being the one used in the particular semiconductor fabrication process. Single and dual damascene copper or copper alloy materials can be used to form metal layer 220. However, FIGS. 2B-2E show use of non-damascene metal layer processing made possible by aluminum metal layers which unlike copper can be directly etched.

Figure 2B:
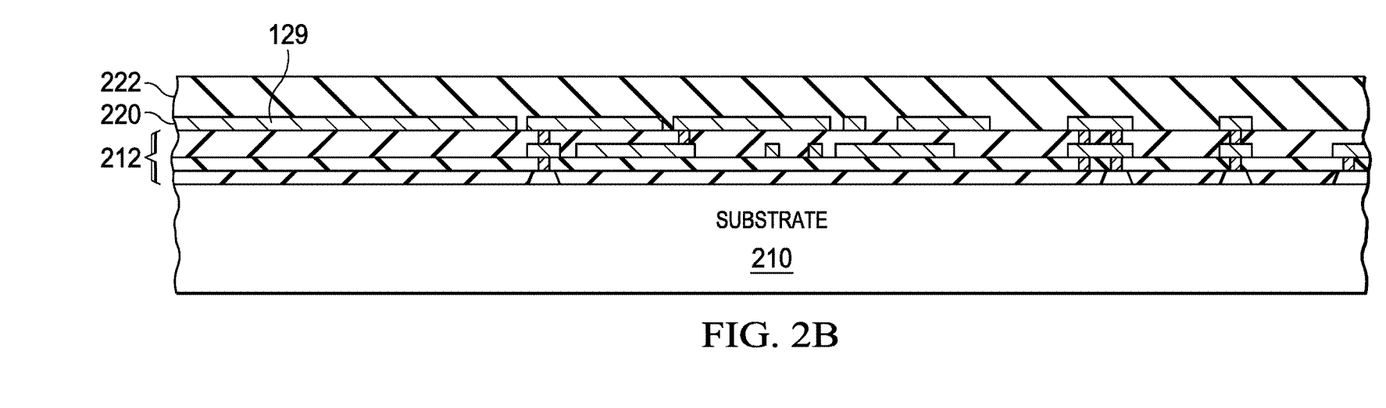
Figure 2C:
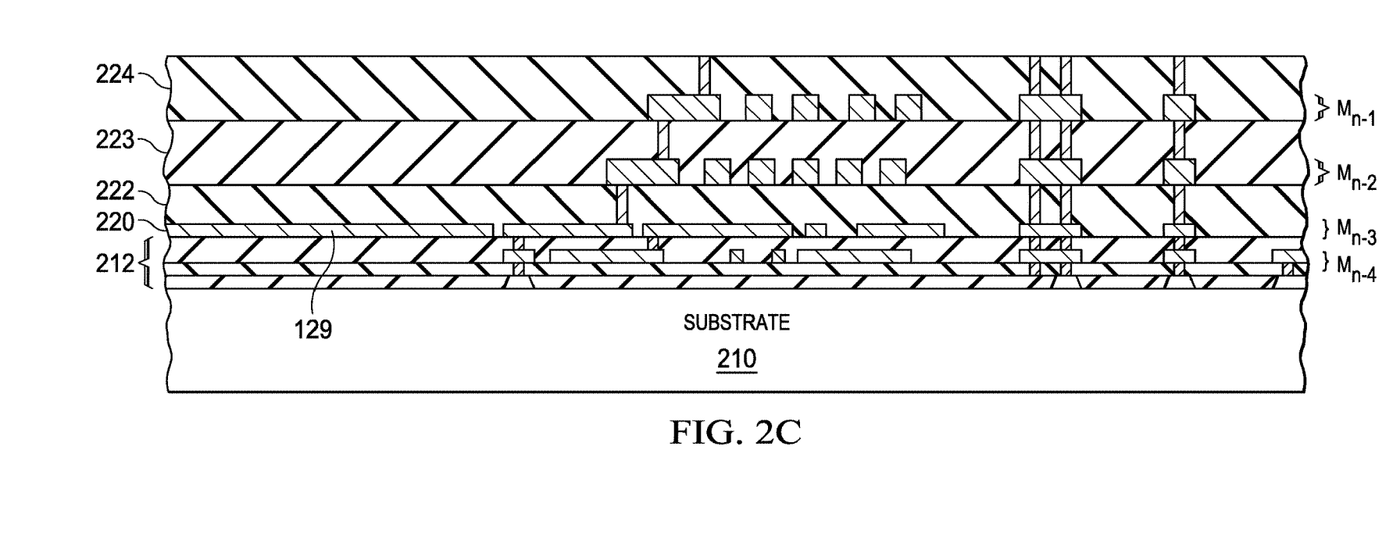

FIG. 2B shows the in-process ISO cap on an IC after patterning of metal layer 220 including to form the bottom plate 129 of the ISO cap, followed by the deposition and subsequent planarization of an ILD layer shown as 222. FIG. 2C shows the in-process ISO cap on an IC after forming several interconnect levels separated by ILD comprising forming vias in an ILD layer, followed by forming patterned metal thereon, followed by forming another dielectric layer thereon, forming vias in the dielectric layer, followed by forming patterned metal, etc. In the region over the bottom plate 129 to form the ISO cap there is only dielectric, shown as ILD layers 222, 223, and 224. The metal level providing the bottom plate 129 is shown as $M_{n-3}$, with metal level $M_{n-2}$ over $M_{n-3}$, and with metal level $M_{n-1}$ over $M_{n-2}$. A metal level below $M_{n-3}$ is shown as $M_{n-4}$ Vias are shown providing connections between adjacent metal levels.

Figure 2D:
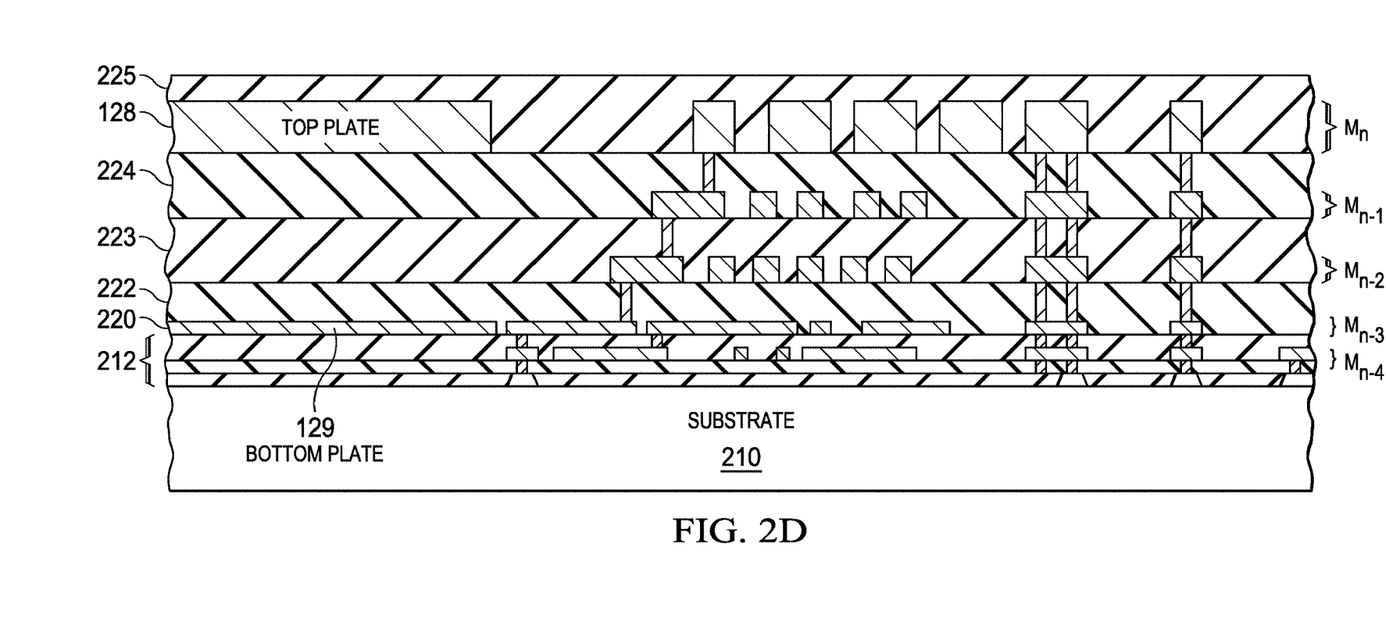
Figure 2E:
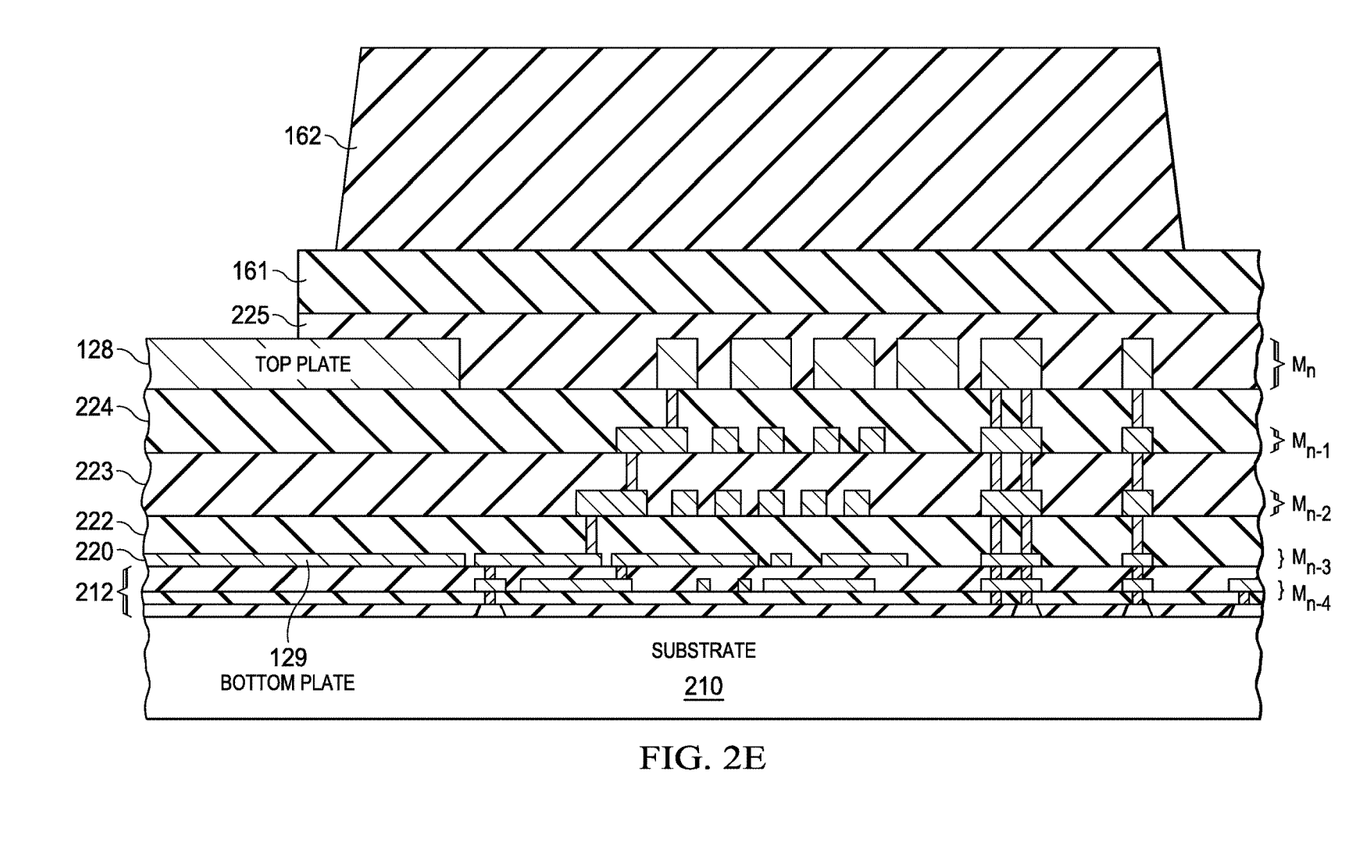

FIG. 2D shows the in-process ISO cap on the IC after forming patterned top metal layer including top plate 128, followed by planarization of a lower protective overcoat (PO) layer 225 which comprises a dielectric material. FIG. 2E shows the in-process ISO cap after depositing a dielectric layer 161 which serves as a PO layer then depositing a dielectric layer 162 which serves as a top PO dielectric layer on dielectric layer 161. This is followed etching an aperture through the dielectric layer 162 and dielectric layer 161 over a portion of the top plate 128 to enabling bonding a bond wire thereto. In one process flow, the PO layer stack comprising bottom PO layer 225 and the dielectric layer 161 is etched first, then dielectric layer 162 is deposited (e.g., a polyimide, generally spun on), then the aperture in dielectric layer 162 is formed (by PI pattern processing) over the pre-existing PO aperture in bottom PO layer 225 and dielectric layer 161. As described above, in one particular arrangement, the dielectric layer 162 can comprise PI and the dielectric layer 161 can comprise a PO layer.

Figure 3A:
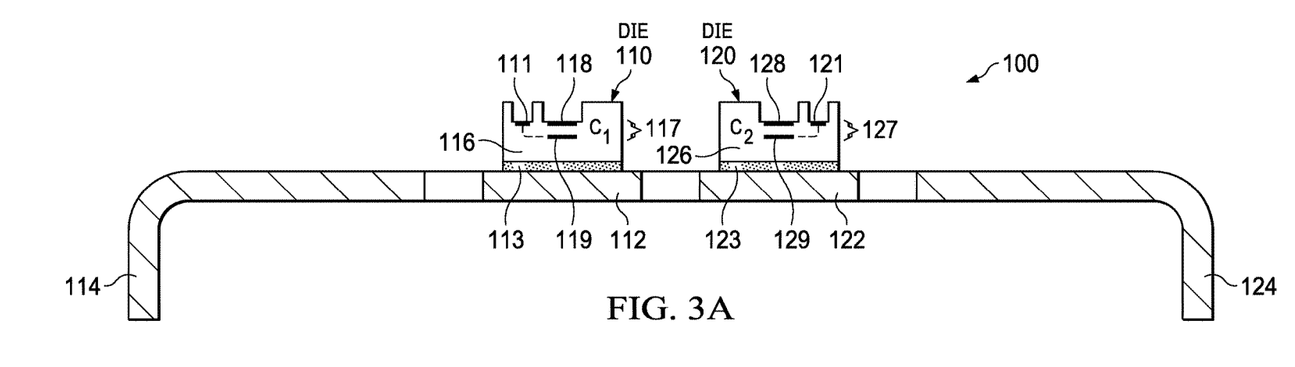
FIG. 3A shows an in-process packaged multichip device after the placing of a first IC die with an ISO cap on a first die pad and the placing of a second IC die with an ISO cap on a second die pad.
Figure 3B:
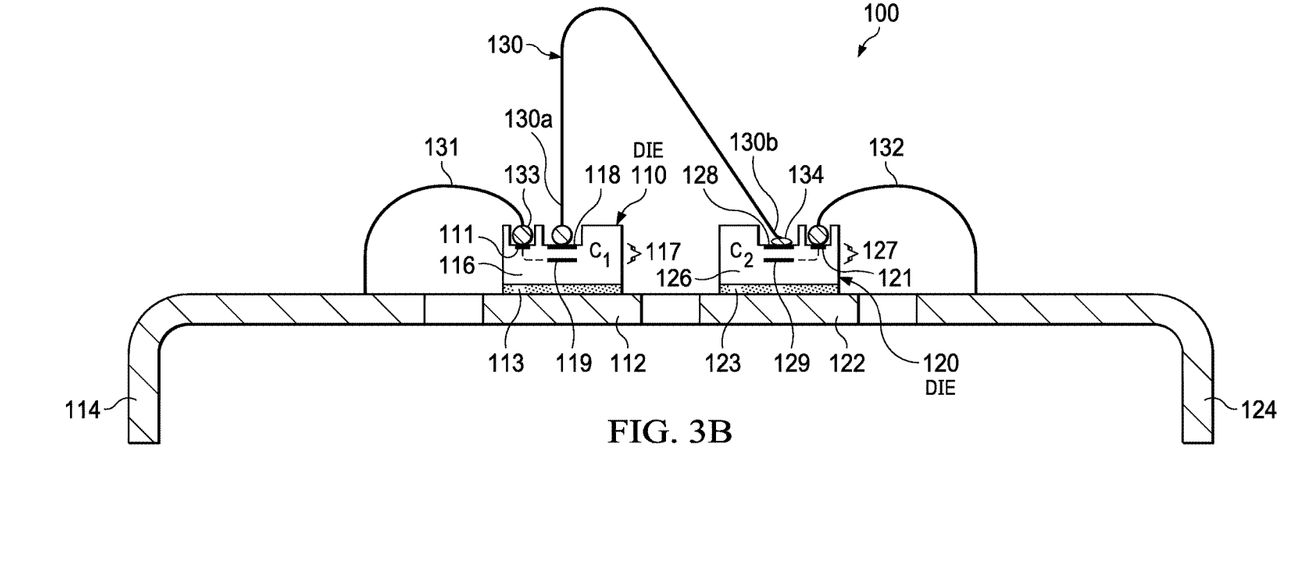
FIG. 3B shows results after wire bonding a bondwire between the top plates of the respective ISO caps including a ball bond on the first top plate, and then a stitch bond that is asymmetrically placed so that a center of the stitch bond is at least 5% further from an edge of the second top plate on a side with the bondwire as compared to a distance of the center of the stitch bond from an opposite edge of the second top plate.

FIG. 3A shows an in-process packaged multichip device after the placing and mounting the IC die using a die attached adhesive shown as a first IC die 110 with an ISO cap $C_1$ on a first die pad 112 and a second IC die 120 with an ISO cap $C_2$ on a second die pad 122. FIG. 3B shows results after wire and stitch bonding including ball placement and then the bonding of a bondwire 130 between the top plates of the respective ISO caps including a ball bond on the first top plate 118, and then a stitch bond that is asymmetrically placed so that a center of its stitch bond is at least 5% further from an edge of the second top plate 128 on a side with the bondwire 130 there over as compared to a distance of the center of the stitch bond from an opposite edge of the second top plate 128.

No modifications are generally needed to a commercial wire bonding machine other than software to implement disclosed asymmetric wire bonding including to provide a high loop profile wirebond that is at an angle that is >25 degrees, such as >30 to 40° (e.g., 35°) departure from the plane of the die surface. This involves setting existing parameters in the wire bonding recipe and no other bonding tool modification. In the last stage of the assembly process, as known in the art, the lead frame is molded in a plastic case using mold compound, and outside of the lead frame is cut-off, separating all the leads to provide the packaged multichip device 100 having reinforced isolation shown in FIG. 1A.

Figure 4A:
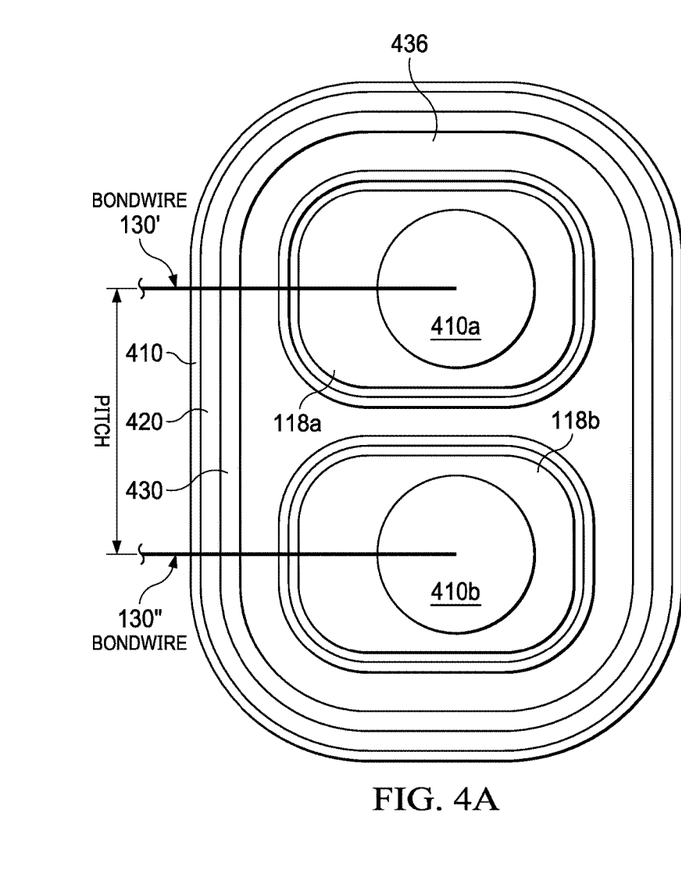
FIGS. 4A and 4B are top perspective views comparing layouts of disclosed ISO caps on an IC die and a reference ISO caps on an IC die, respectively.
Figure 4B:
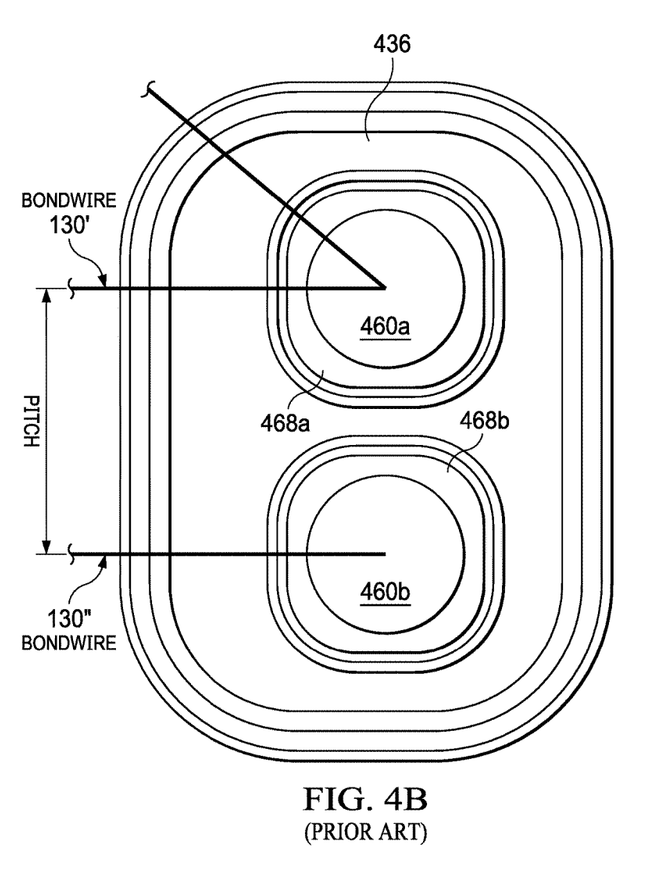

FIGS. 4A and 4B are top perspective views comparing layouts of a disclosed ISO caps on an IC and reference ISO caps on an IC, respectively. Three metal layers are shown, a top metal layer (layer n) that provides the top plates 118a, 118b shown in FIG. 4A and the top plates 468a, 468b shown in FIG. 4B, and a guard ring 410, metal layer n-1 shown including its guard ring 420, and metal layer n-2 shown including its guard ring 430. Layer 436 is an n-3 metal layer that can be part of a surrounding ground shield for the ISO caps.

In FIG. 4A, there are 2 ISO caps shown on the IC die that can have a center-to-center spacing of 160 µm. The top plate dielectric apertures 410a and 410b can be seen to be asymmetrically placed to the right of the center of their respective top plates 118a, 118b so that when the bondwires 130', 130" shown are stitch bonded to these top plates, these bondwires 130', 130" will overlap their top plate on the bondwire crossover side by an additional amount as compared to conventional layout shown in FIG. 4B that has the top plate dielectric apertures shown as 460a and 460b placed in the center of their respective top plates 468a, 468b. In one example, the bondwires 130', 130" overlap their top plates on the bondwire crossover side by 47 µm, vs. an overlap of 15 µm for the conventional layout shown in FIG. 4B that has the top plate dielectric apertures shown as 460a and 460b placed in the center of their respective top plates 468a, 468b.

The asymmetric bonding of bondwires to the HV ISO cap as close as possible to the side opposite the bondwire crossover side allows the HV bondwire to achieve a maximum distance from the low voltage regions of the IC die, resulting in a reduced E field which extends the lifetime of the isolation barrier. Per E-field simulations performed, disclosed asymmetric bonding of bondwires to the HV ISO caps reduced the maximum local E-field in the MC surrounding the bondwire from 187V/µm to 141V/µm. Functionally, because the bondwire is further from the die surface in this configuration than would otherwise be the case in a conventional "centered" bonding arrangement, the low voltage portions of the IC die can be brought closer to the HV cap, which can also enable a die size reduction. For example, the asymmetric bonding of bondwires to the HV ISO cap can also be used to achieve a die size reduction of −20% without reducing the distance between overhead bondwire-to-ground features.

Disclosed aspects can be used to form multichip modules that may utilize a variety of assembly flows to form a variety of different devices and related products. The semiconductor die utilized in disclosed multichip modules may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this Disclosure relates will appreciate that many other aspects and variations of aspects are possible within the scope of the claimed invention, and further additions, deletions, substitutions and modifications may be made to the described aspects without departing from the scope of this Disclosure.

The invention claimed is:

1. A packaged multichip device having reinforced isolation, comprising:
a first integrated circuit (IC) die on a first die pad including functional circuitry with a metal stack thereon including a top metal layer and a plurality of lower metal layers, at least a first isolation capacitor (first ISO cap) utilizing said top metal layer as a first top plate having a top dielectric layer thereon with a top plate dielectric aperture and one of said plurality of lower metal layers as its first bottom plate;
a second IC die on a second die pad including functional circuitry with a metal stack thereon including a top metal layer and a plurality of lower metal layers, including at least a second ISO cap utilizing said top metal layer as a second top plate having a top dielectric layer thereon having a top plate dielectric aperture and one of said plurality of lower metal layers as its second bottom plate;
a first end of a bondwire coupled within said top plate dielectric aperture on said first top plate, and
a second end of said bondwire coupled within said top plate dielectric aperture on said second top plate,
wherein said second end of said bondwire includes a stitch bond including a wire approach angle that is not normal to said second top plate, and
wherein said stitch bond is asymmetrically placed so that a center of said stitch bond is positioned at least 5% further from an outer edge of said second top plate on a bondwire crossover side as compared to a distance of said center of said stitch bond from a side opposite to said bondwire crossover side.

2. The packaged multichip device of claim 1, wherein said IC die each include a plurality of said ISO caps.

3. The packaged multichip device of claim 1, wherein said top dielectric layer extends over said second top plate at least 80% more on said bondwire crossover side as compared to a distance said top dielectric layer extends over said second top plate from said side opposite to said bondwire crossover side.

4. The packaged multichip device of claim 1, wherein said first ISO cap and said second ISO cap both have silicon oxide as their capacitor dielectric layer.

5. The packaged multichip device of claim 4, wherein a thickness of said capacitor dielectric layer is at least 4 µm, and wherein said first ISO cap and said second ISO cap both provide a breakdown voltage of at least 2,000 Volts.

6. The packaged multichip device of claim 1, further comprising a mold compound which surrounds said bondwire.

7. The packaged multichip device of claim 1, wherein said wire approach angle is at least 30° relative to said top plate of said second die.

8. The packaged multichip device of claim 1, wherein said center of said stitch bond is positioned at least 50% further from said outer edge of said second top plate.

9. The packaged multichip device of claim 1, wherein said first IC die comprises a transmitter and wherein said second IC die comprises a receiver.

10. The packaged multichip device of claim 1, wherein said top dielectric layer comprises a first dielectric layer on a second dielectric layer.

11. A method of assembling a packaged multichip device having reinforced isolation, comprising:

placing a first integrated circuit (IC) die on a first die pad including functional circuitry with a metal stack thereon including a top metal layer and a plurality of lower metal layers, including at least a first isolation capacitor (first ISO cap) utilizing said top metal layer a first top plate having a top dielectric layer thereon with a top plate aperture and one of said plurality of lower metal layers as its bottom plate;

placing a second IC die on a second die pad including functional circuitry with a metal stack thereon including a top metal layer and a plurality of lower metal layers, including at least a second ISO cap utilizing said top metal layer a second top plate having a top dielectric layer thereon having a top plate aperture and one of said plurality of lower metal layers as its bottom plate;

bonding a first end of a bondwire within said top plate aperture on said first top plate;

bonding a second end of said bondwire within said top plate aperture on said second top plate, wherein said second end of said bondwire includes a stitch bond including a wire approach angle that is not normal to said top plate of said second die;

wherein said stitch bond is an asymmetrically placed bond so that a center of said stitch bond is at least 5% further from an outer edge of said second top plate on a bondwire crossover side as compared to a distance of said center of said stitch bond from a side opposite to said bondwire crossover side.

12. The method of claim 11, wherein said IC die each include a plurality of said ISO caps.

13. The method of claim 11, wherein said top dielectric layer extends over said second top plate at least 80% more on said bondwire crossover side as compared to a distance said top dielectric layer extends over said second top plate from said side opposite to said bondwire crossover side.

14. The method of claim 11, wherein said first ISO cap and said second ISO cap both have silicon oxide as their capacitor dielectric layer.

15. The method of claim 14, wherein a thickness of said capacitor dielectric layer is at least 4 µm, and wherein said first ISO cap and said second ISO cap both provide a breakdown voltage of at least 2,000 Volts.

16. The method of claim 11, further comprising forming a mold compound which surrounds said bondwire.

17. The method of claim 11, wherein said wire approach angle is at least 25° relative to said top plate of said second die.

18. The method of claim 11, wherein said center of said stitch bond is positioned at least 50% further from said outer edge of said second top plate.

19. The method of claim 11, wherein said first IC die comprises a transmitter and wherein said second IC die comprises a receiver.

20. The method of claim 11, wherein said top dielectric layer comprises a first dielectric layer on a second dielectric layer.

* * * * *